United States Patent
Wu et al.

(10) Patent No.: US 6,642,749 B1
(45) Date of Patent: Nov. 4, 2003

(54) LATCHING SENSE AMPLIFIER WITH TRI-STATE OUTPUT

(75) Inventors: Sifang Wu, Savage, MN (US); Steven M. Peterson, Eagan, MN (US); Mai T. MacLennan, Plymouth, MN (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/256,752

(22) Filed: Sep. 27, 2002

(51) Int. Cl.[7] ................................................. G11C 7/06
(52) U.S. Cl. ......................................... 327/55; 327/57
(58) Field of Search ............................. 327/51–57, 112; 326/56–58

(56) References Cited

U.S. PATENT DOCUMENTS

| | | | | |
|---|---|---|---|---|
| 5,546,537 A | * | 8/1996 | McClure | 365/201 |
| 5,563,835 A | * | 10/1996 | Oldham | 327/52 |
| 5,764,086 A | * | 6/1998 | Nagamatsu et al. | 327/65 |
| 6,268,747 B1 | * | 7/2001 | Barnes | 327/55 |
| 6,307,400 B1 | * | 10/2001 | Kim et al. | 326/57 |
| 6,459,299 B1 | * | 10/2002 | Hirano et al. | 326/58 |

* cited by examiner

*Primary Examiner*—Toan Tran
(74) *Attorney, Agent, or Firm*—Westman, Champlin & Kelly

(57) ABSTRACT

A tri-state sense amplifier is provided, which includes an enable input, a latch and an output driver. The latch has first and second complementary inputs and first and second complementary latch outputs, which are gated by the enable input. The output driver includes a data output, a pull-up transistor coupled to the data output and having a control terminal coupled to the first latch output, and a pull-down transistor coupled to the data output and having a control terminal coupled to the second latch output.

16 Claims, 4 Drawing Sheets

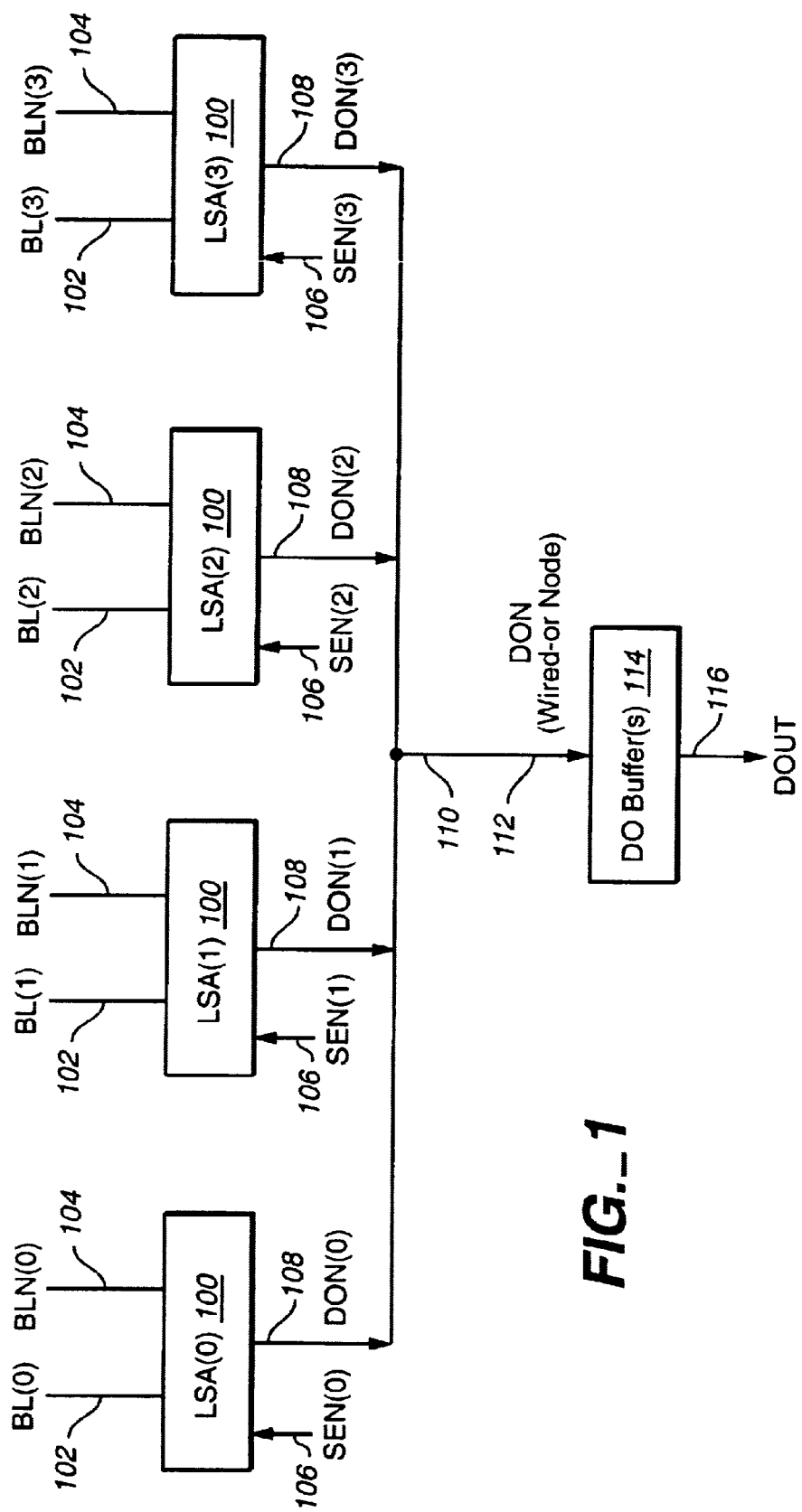
FIG._1

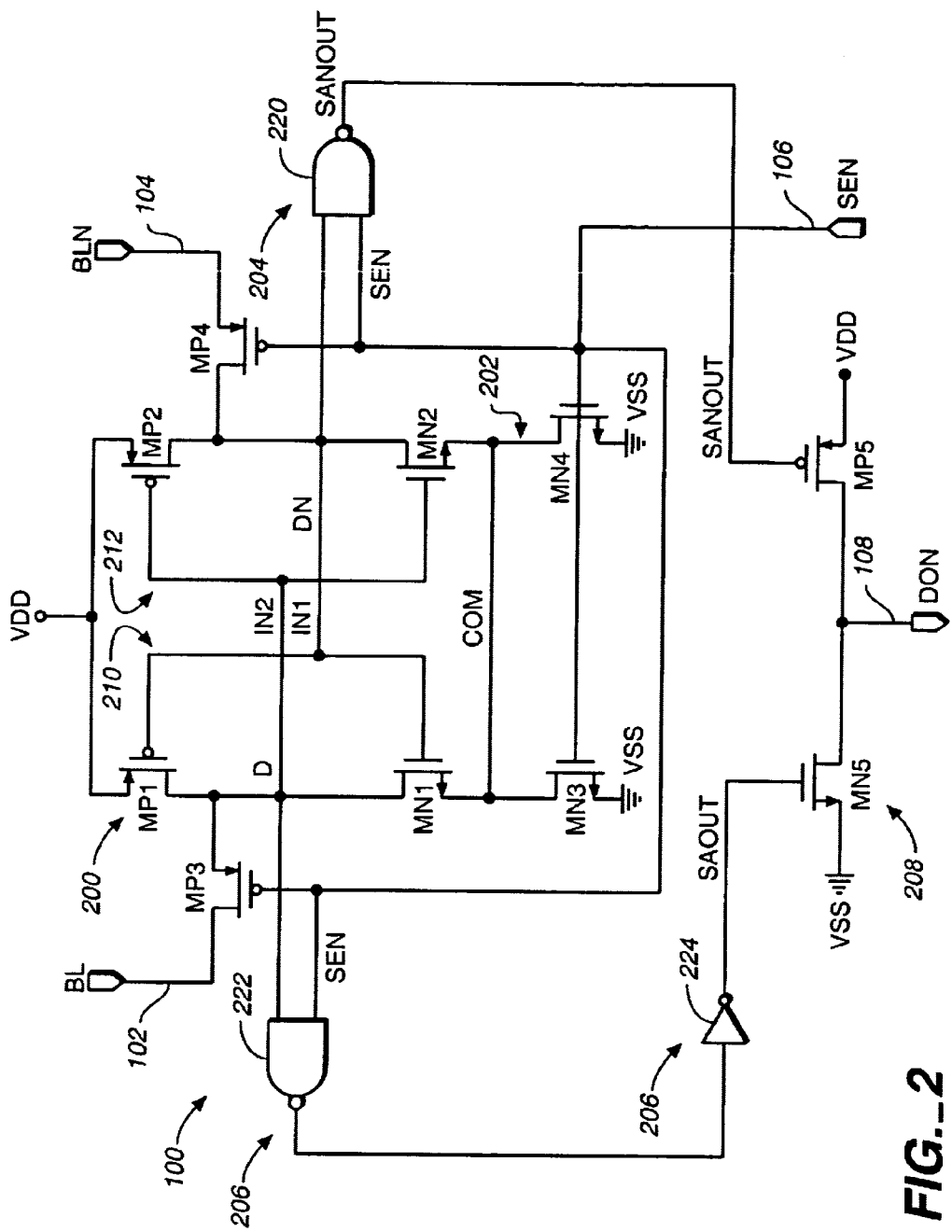
FIG._2

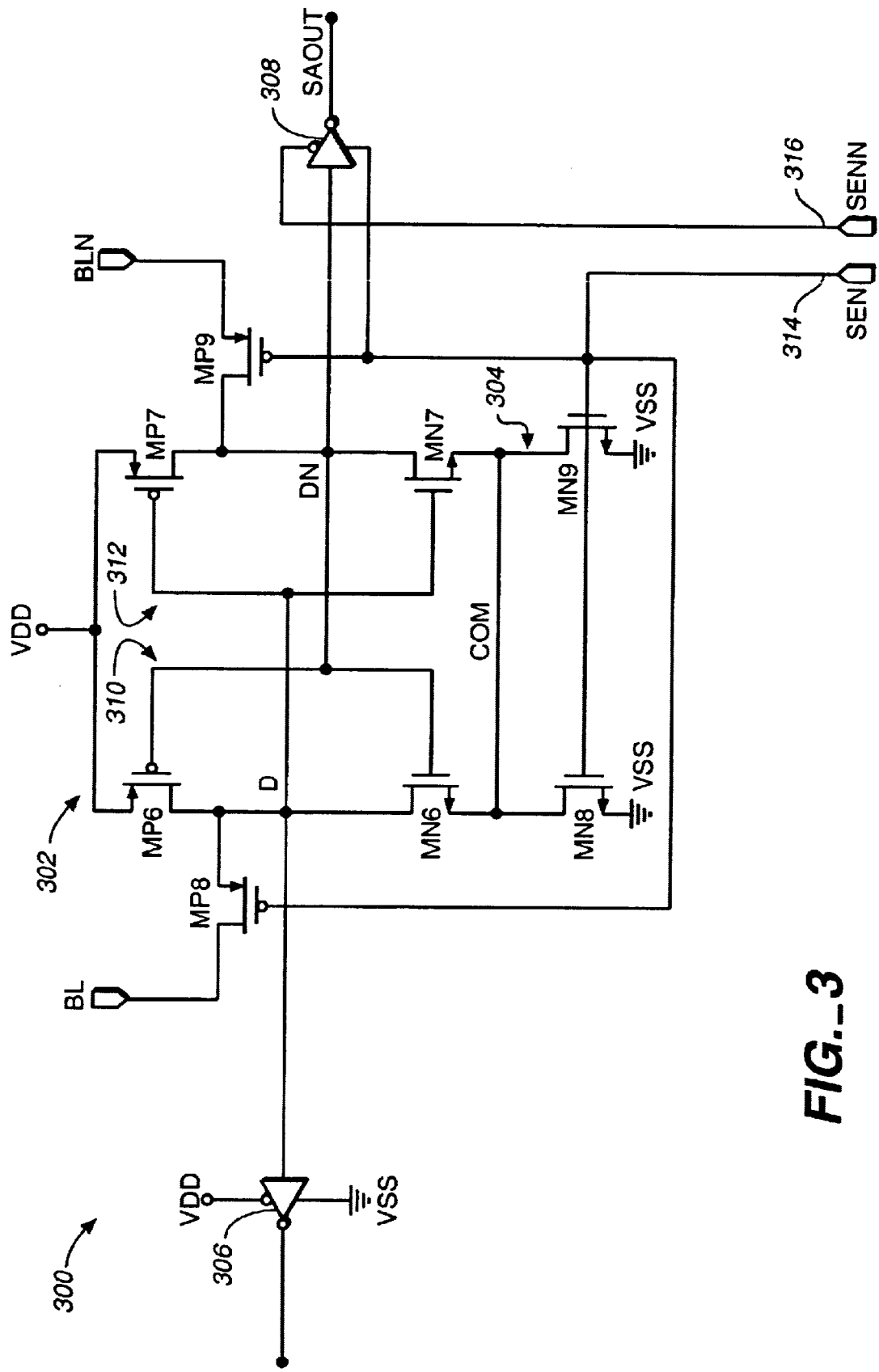
FIG._3

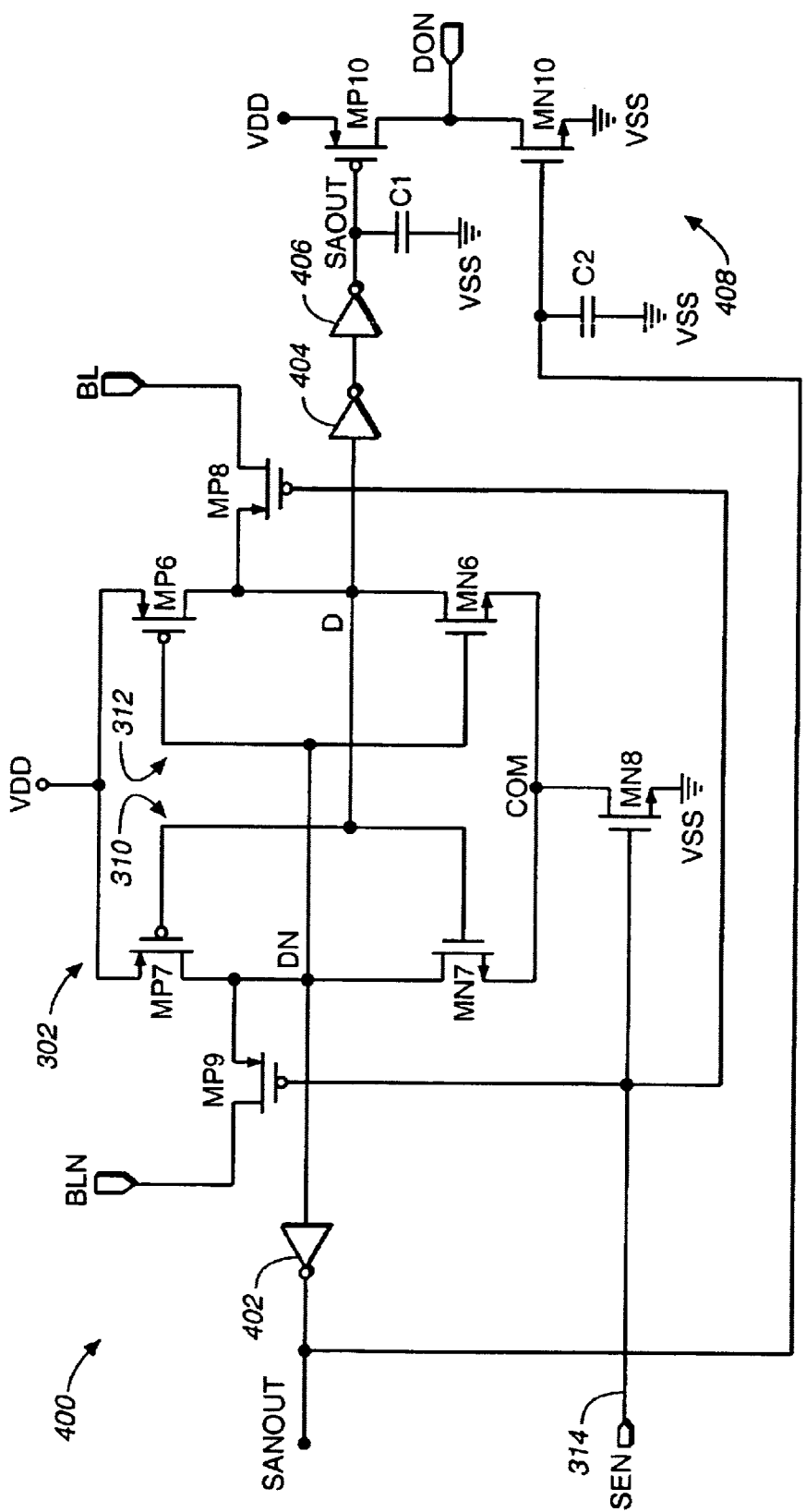
FIG._4

LATCHING SENSE AMPLIFIER WITH TRI-STATE OUTPUT

BACKGROUND OF THE INVENTION

The present invention relates to sense amplifiers for semiconductor integrated circuit memories and, more particularly, to a latching sense amplifier having a tri-state output.

Semiconductor integrated circuit memories include a plurality of memory elements or cells, which are arranged in rows and columns. The memory cells in each column are coupled to a respective pair of complementary bit lines. Each pair of bit lines has a differential voltage representing the data being read from or written to a memory cell in that column.

A typical memory I/O buffer includes a column multiplexer, a sense amplifier and a write driver. The column multiplexer multiplexes groups of bit lines into respective data input-output lines. There is a sense amplifier and a write driver for each pair of multiplexed data input-output lines.

In some applications, the sense amplifiers have tri-state output stages that allow the outputs of a group of sense amplifiers to be coupled together to a single "wired-OR" node. This wired-OR node can then be coupled to a data output buffer or latch. In these applications, the column multiplexing function can be combined with the enable signals provided to the sense amplifiers such that only one sense amplifier in the group is enabled at one time.

Existing sense amplifiers having tri-state outputs have several disadvantages. For example, sense amplifiers having outputs that are driven by tri-state inverters typically use stacked MOS devices in the output driver, which reduce the drive strength of the output driver by half. In order to increase the drive strength, the MOS devices are formed larger and therefore consume more area on the integrated circuit. Also, larger MOS devices add more capacitive load to the outputs, causing the sense amplifier to become slower. In addition, the timing of the output transition when reading a high value and when reading a low value may not be balanced, so the overall delay from when the enable signal becomes active to a transition on the data output is long.

In another example, both latch outputs are used to drive respective pull-up and pull-down transistors in an output stage. While this type of circuit can have faster output switching and greater drive strength, the output cannot be used directly in a wired-OR implementation since voltage levels within unselected sense amplifiers can leak through the output driver and disrupt the wired-OR node.

Improved tri-state latching sense amplifiers are desired which have fast output switching and consume a relatively small area when fabricated.

SUMMARY OF THE INVENTION

One embodiment of the present invention is directed to a tri-state sense amplifier, which includes an enable input, a latch and an output driver. The latch has first and second complementary inputs and first and second complementary latch outputs, which are gated by the enable input. The output driver includes a data output, a pull-up transistor coupled to the data output and having a control terminal coupled to the first latch output, and a pull-down transistor coupled to the data output and having a control terminal coupled to the second latch output.

Another embodiment of the present invention is directed to a tri-state sense amplifier, which includes an enable input, a latch and an output driver. The latch includes first and second complementary inputs and first and second complementary latch outputs. The output driver includes a data output, a pull-up transistor coupled to the data output and having a control terminal driven by the first latch output, and a pull-down transistor coupled to the data output and having a control terminal driven by the second latch output. A first logic gate is coupled between the first latch output and the control terminal of the pull-up transistor and gates the first latch output with the enable input. A second logic gate is coupled between the second latch output and the control terminal of the pull-down transistor and gates the second latch output with the enable input.

Yet another embodiment of the present invention is directed to a tri-state sense amplifier, which includes an enable input, a latch, a logic circuit and an output driver. The latch has first and second complementary inputs and first and second complementary latch outputs. The logic circuit gates the first and second latch outputs with the enable input to produce first and second complementary gated outputs, respectively. The output driver produces a data output based on the first and second complementary gated outputs, wherein the data output has either a logic high state, a logic low state or a high impedance state.

BRIEF DESCRIPTION OF THE DRAWINGS

FIG. 1 is a block diagram illustrating a plurality of latching sense amplifiers coupled in a wired-OR implementation according to one embodiment of the present invention.

FIG. 2 is a diagram illustrating one of the latching sense amplifiers in greater detail according to one embodiment of the present invention.

FIG. 3 is a diagram illustrating a latching sense amplifier according to the prior art.

FIG. 4 is a diagram illustrating another latching sense amplifier according to the prior art.

DETAILED DESCRIPTION OF THE PREFERRED EMBODIMENTS

FIG. 1 is a diagram illustrating a plurality of latching sense amplifiers 100 (labeled LSA(0)–LSA(3)), which are coupled together in a wire-or implementation according to one embodiment of the present invention. Latching sense amplifiers 100 each have a respective pair of complementary bit line inputs BL(0)–BL(3) and BLN(0)–BLN(3), which are coupled to respective columns of memory cells (not shown) of the memory in which the latching sense amplifiers are used. Each latching sense amplifier 100 further includes a sense enable input 106 (labeled SEN(0)–SEN(3)) and an inverted data output 108 (labeled DON(0)–DON(3)). Inverted data outputs DON(0)–DON(3) are coupled to wired-OR node 110. Node 110 is coupled to input 112 of data output buffer 114. In one embodiment, data output buffer 114 includes one or more inverters coupled in series between input 112 and output 116. Buffer output 116 is coupled to data output DOUT.

Sense enable inputs 106 each have an active state and an inactive state. The column addressing circuitry (not shown) that is associated with the memory activates only one of the sense enable inputs at one time for each group of latching sense amplifiers 100. Data outputs 108 can each have a logic high state, a logic low state or a high impedance state.

When the sense enable input 106 to a sense amplifier 100 is inactive, the data output 108 of that sense amplifier is driven to the high impedance state. Therefore, the data outputs 108 of all unselected sense amplifiers 100 are in the high impedance sate. The sense enable input 106 of the selected column is active and enables the selected latching sense amplifier 100 to drive its output 108 to a logic high or logic low state depending on the relative logic states of bit line inputs 102 and 104.

In an alternative embodiment, latching sense amplifiers 100 provide non-inverted data outputs to wired-OR node 110, and data output buffer 114 is non-inverting. In another alternative embodiment, latching sense amplifiers 100 provide both non-inverting and inverting data outputs, which are coupled to respective wired-OR nodes and buffered through a suitable buffer 114. Any number of latching sense amplifiers 100 can be used in alternative embodiments of the present invention.

FIG. 2 is a diagram illustrating one of the sense amplifiers 100 in greater detail. Sense amplifier 100 includes a latch 200, a latch enable circuit 202, output logic gates 204 and 206 and output driver 208. Latch 200 includes cross-coupled inverters 210 and 212, which are coupled between complementary output nodes D and DN. Inverter 210 includes N-channel transistor MN1 and P-channel transistor MP1. Inverter 212 includes N-channel MN2 and P-channel transistor MP2.

Inverter 210 has an input IN1 coupled to output node DN and an output coupled to node D. Inverter 212 has an input IN2 coupled to node D and an output coupled to node DN. Within inverter 210, transistor MN1 has a gate coupled to input IN1, a source coupled to common node COM, and a drain coupled to output node D. Transistor MP1 has a gate coupled to input IN1, a source coupled to voltage supply terminal VDD and a drain coupled to output node D. Within inverter 212, transistor MN2 has a gate coupled to input IN2, a source coupled to common node COM and a drain coupled to output node DN. Transistor MP2 has a gate coupled to input node IN2, a source coupled to voltage supply terminal VDD and a drain coupled to output node DN.

Latch enable circuit 202 is coupled in series between common node COM and voltage supply terminal VSS. Latch enable circuit 202 includes Nchannel transistors MN3 and MN4. Transistors MN3 and MN4 each have a gate coupled to sense enable input 106 (labeled SEN), a source coupled to voltage supply terminal VSS and a drain coupled to common node COM.

Pass-gate transistor MP3 is coupled in series between bit line input 102 (labeled BL) and output node D and has a gate coupled to sense enable input 106, a source coupled to output node D and a drain coupled to bit line BL. Pass-gate transistor MP4 is coupled in series between bit line input 104 (labeled BLN) and output node DN and has a gate coupled to sense enable input 106, a source coupled to bit line 3LN and a drain coupled to output node DN.

Output logic gate 204 includes a logic NAND gate 220 having a first input coupled to output node DN, a second input coupled to sense enable input 106 and an output coupled to inverted sense enable output SANOUT. Output logic gate 206 includes a logic AND gate formed by NAND gate 222 and inverter 224. NAND gate 222 has a first input coupled to output node D, a second input coupled to sense enable input 106 and an output coupled to the input of inverter 204. The output of inverter 204 is coupled to sense enable output SAOUT.

Output driver 208 includes P-channel pullup transistor MP5 and N-channel pull-down transistor MN5. Transistor MP5 has a gate coupled to SANOUT, a source coupled to voltage supply terminal VDD and a drain coupled to inverted data output 108 (labeled DON). Pull-down transistor MP6 has a gate coupled to SAOUT, a source coupled to voltage supply terminal VSS and a drain coupled to DON.

When latching sense amplifier 100 is not selected, sense enable input 106 is in an inactive, logic low state. Enable transistors MN3 and MN4 are off and de-couple latch 200 from VSS. Pass-gate transistors MP3 and MP4 are on and couple bit lines BL and BLN to nodes D and DN respectively. If none of the word lines in the memory are active, such that no memory cells are driving, BL and BLN, transistors MP1 and MP2 pull nodes D and DN to a pre-charged, logic high state. With sense enable SEN low, NAND gate 220 forces SANOUT high, and NAN gate 222 forces SAOUT low. Pull-up and pull-down transistors MP5 and MN5 are off, thereby placing inverted data output DON in the high impedance state.

During a read access, one of the word lines in the memory is activated and the memory cell in that row that is coupled to bit lines BL and BLN drives BL and BLN to complementary logic state. The voltages on D and DN begin to separate from one another even though enable transistors MN3 and MN4 remain off. After a predetermined time period, the column addressing circuitry (not shown) activates the sense enable input SEN of the selected column to a logic high state. Latch enable transistors MN3 and MN4 turn on, pulling common node COM low. Pass-gate transistors MP3 and MP4 turn off, thereby isolating the large capacitances on BL and BLN from nodes D and DN. With COM pulled low, nodes D and DN rapidly switch toward complementary logic states due to the strong positive feedback provided by cross-coupled inverters 210 and 212.

Since SEN is high, NAND gate 220 passes the logic state on output node DN to SANOUT, and NAND gate 222 passes the logic state on output node D to SAOUT through inverter 224. When reading a logic high bit from the selected memory cell memory, the voltage on BL is greater than the voltage on BLN, causing output node D to go high and output node DN to go low. With NAND gates 220 and 222 enabled, SANOUT and SAOUT both go high. Therefore, pull-up transistor MP5 turns off and pull-down transistor MN5 turns on. Pull-down transistor MN5 pulls DON low toward voltage supply terminal VSS. The resulting data bit is then inverted by buffer 114 (shown in FIG. 2) and driven to data output DOUT.

When reading a logic low bit from the selected memory cell, the voltage on BL is less than the voltage on BLN, causing data output D to go low and data output DN to go high. SANOUT and SAOUT both go low causing pull-up transistor MP5 to turn on and pull-down transistor MN5 to turn off. Pull-up transistor MP5 pulls DON high toward the voltage on voltage supply terminal VDD. The resulting data bit is then inverted by buffer 114 (shown in FIG. 2) and driven to data output DOUT.

Sense amplifier 100 has a high performance in terms of switching speed and consumed area. When reading a logic high value from a memory cell, output node D is already in the precharged state, while output node DN must fall to a logic low level. Since output node D is already high, transistor MNS quickly turns on to begin discharging inverted data output DON. When reading a logic low value, output node DN remains high and output node D falls low. Output node DN can therefore quickly turn on transistor MP5 to begin charging inverted data output DON. By placing the longer path (through NAND gate 222 and inverter 224) on the faster output D, the switching speed on output DON can be better balanced between high and low reads.

Also, sense amplifier 100 consumes less semiconductor area since output driver 208 does not require transistors MP5 and MN5 to be formed as arrays of parallel-connected transistors or as larger transistors in order to sufficiently drive inverted data output DON. In addition, sense amplifier 100 requires only a single-ended sense enable input SEN rather than a complementary pair of sense enable inputs. This reduces the logic required to generate the sense enable input.

FIG. 3 is a diagram illustrating a latching sense amplifier 300 having a lower performance than sense amplifier 100 shown in FIG. 2. Sense amplifier 300 includes a latch 302, a latch enable circuit 304, and tri-state inverters 306 and 308. Latch 302 includes an inverter 310 formed by N-channel transistor MN6 and P-channel transistor MP6 and an inverter 312 formed by N-channel transistor MN7 and P-channel transistor MP7. Inverters 310 and 312 are cross-coupled with one another between output nodes D and DN to form a latch element. Latch enable circuit 304 is coupled in series with latch 302, between latch 302 and voltage supply terminal VSS. Latch enable circuit 304 includes N-channel transistor MN8 and N-channel transistor MN9, which have gates coupled to sense enable input 314. Nodes D and DN are coupled to bit lines BL and BLN through P-channel pass-gate transistors MP8 and MP9, respectively, which have gates coupled to sense enable input 314.

Data output node D is coupled to the input of tri-state inverter 306, and data output DN is coupled to the input of tri-state 308. The output of inverter 306 is unused, and the output of inverter 308 is coupled to sense amplifier output SAOUT. Inverter 306 has an activ-low enable input coupled to VDD and an active-high enable input coupled to VSS such that inverter 306 is held in a permanently disabled state. Inverter 306 balances the capacitive loading on D and DN. Inverter 308 has an active-high enable input coupled to sense enable input 314 and an active-low enable input coupled to inverted sense enable input 316 (labeled SENN).

When SEN is low and SENN is high, sense amplifier 300 is disabled and SAOUT is in a high impedance state. When SEN is high and SENN is low, sense amplifier 300 is enabled, and the logic state of SAOUT is equal to the inverse of the logic state on DN. If the voltage on BL is greater than the voltage on BLN, output node D is high, output node DN is low, and SAOUT is high. If the voltage on BL is less than the voltage on BLN, output node D is low, output node DN is high, and SAOUT is low.

With this type of sense amplifier configuration, two or more inverter stages are typically used to buffer SAOUT to data output DOUT. Tri-state inverters 306 and 308 are formed with stacked MOS devices (MOS devices connected in series with one another) in order to implement the tri-state function. The output drive strengths of the inverters are therefore reduced by about half. In order to have the required drive strength, the MOS devices in the inverters are formed larger, which consumes more semiconductor area. Also, when the inverters are made larger, they add more load to nodes D and DN which potentially causes the switching speed of latch 302 to become slower. Also, the switching speed between reading a logic high value and a logic low value is not balanced, such that the overall time between the activation of SEN and SENN and the switching of data output DOUT is slow. These difficulties are avoided in the latching sense amplifier shown in FIG. 2.

FIG. 4 is a diagram illustrating a further latching sense amplifier 400 of the prior art. The same reference numerals are used in FIG. 4 as where used in FIG. 3 for the same or similar elements. In this circuit, output node DN is coupled to inverted sense amplifier output SANOUT through an inverter 402, and output node D is coupled to sense amplifier SAOUT through a pair of inverters 404 and 406. SAOUT and SANOUT are coupled to an output driver circuit 408, which is formed by capacitors C1 and C2, N-channel transistor MN10 and P-channel transistor MP10.

Capacitor C1 is coupled between SAOUT and VSS, and capacitor C2 is coupled between SANOUT and VSS. Transistor MP10 has a gate coupled to SAOUT, a source coupled to VDD and a drain coupled to DON. Transistor MN10 has a gate coupled to SANOUT, a source coupled VSS and a drain coupled DON.

Sense amplifier 400 is faster than sense amplifier 300 since either MN10 or MP10 is on so that there is minimal "crow-bar" current between the two transistors. In addition, MN10 and MP10 are not stacked and therefore have more drive strength and uses less semiconductor area.

However data output DON of sense amplifier 400 cannot be used directly in a wired-or implementation. When sense amplifier 400 is unselected, SEN is low, which allows D or DN to be discharged to a low level. This low level can turn on the respective output transistor MN10 or MP10 and thus disturb the wired-or node. Again, the latching sense amplifier shown in FIG. 2 avoids this difficulty since its output has a high impedance state when unselected.

Although the present invention has been described with reference to preferred embodiments, workers skilled in the art will recognize that changes may be made in form and detail without departing from the spirit and scope of the invention. For example, any suitable latch can be used, and any output logic gate can be used to gate the latch outputs with the sense enable input. The AND gate and NAND gate are shown as examples only. The present invention can be implemented with a variety of semiconductor technologies, such as CMOS. Also, the sense amplifier can be used in memory or non-memory applications. Various circuit configurations can be used. The transistors shown in the figures can include individual transistors or arrays of transistors coupled together in parallel with one another. The voltage supply terminals can be relatively positive or relatively negative depending upon the particular convention adopted and the technology used and can include a power supply bus or a biased referenced terminal having a voltage other than that of the power supply bus, for example. The terms "high" and "low" used in the specifications and the claims are arbitrary terms and are interchangeable with a logical inversion of the circuit. Likewise, the term "coupled" can include various types of connections or couplings and can include a direct connection or a connection through one or more intermediate components.

What is claimed is:

1. A tri-state sense amplifier comprising:
   an enable input;
   a latch comprising first and second complementary inputs and first and second complementary latch outputs, which are gated by the enable input;
   first and second voltage supply terminals, wherein the latch is biased between the first and second voltage supply terminals;
   an enable circuit coupled in series between the latch and the second voltage supply terminal and having an enable control terminal coupled to the enable input; and
   an output driver comprising a data output, a pull-up transistor coupled to the data output and having a control terminal coupled to the first latch output, and a pull-down transistor coupled to the data output and having a control terminal coupled to the second latch output.

2. The tri-state sense amplifier of claim 1 wherein the latch further comprises:

first and second complementary output nodes;

a first logic gate having a first logic input coupled to the first output node, a second logic input coupled to the enable input, and a first gate output coupled to the control terminal of the pull-up transistor; and a second logic gate having a third logic input coupled to the second output node, a fourth logic input coupled to the enable input, and a second gate output coupled to the control terminal of the pull-down transistor.

3. The tri-state sense amplifier of claim 2 wherein the first logic gate comprises a logic NAND gate.

4. The tri-state sense amplifier of claim 2 wherein the second logic gate comprises a logic AND gate.

5. The tri-state sense amplifier of claim 1 wherein one of the pull-up and pull-down transistors comprises a P-channel transistor and the other comprises an N-channel transistor.

6. The tri-state sense amplifier of claim 1 wherein the latch comprises:

a pair of cross-coupled inverters, which are coupled between the first and second complementary inputs and the first and second latch outputs.

7. The tri-state sense amplifier of claim 1 wherein the enable circuit comprises at least one N-channel transistor coupled in series between the latch and the second voltage supply terminal and having a gate coupled to the enable input.

8. The tri-state sense amplifier of claim 1 and further comprising:

a first isolation transistor coupled in series with the first input and having a control terminal coupled to the enable input; and a second isolation transistor coupled in series with the second input and having a control terminal coupled to the enable input.

9. A tri-state sense amplifier comprising:

an enable input;

a latch comprising first and second complementary inputs and first and second complementary latch outputs;

first and second voltage supply terminals, wherein the latch is biased between the first and second voltage supply terminals;

an enable circuit coupled in series between the latch and the second voltage supply terminal and having an enable control terminal coupled to the enable input;

an output driver comprising a data output, a pull-up transistor coupled to the data output and having a control terminal driven by the first latch output, and a pull-down transistor coupled to the data output and having a control terminal driven by the second latch output;

first logic gate coupled between the first latch output and the control terminal of the pull-up transistor, and gates the first latch output with the enable input; and second logic gate coupled between the second latch output and the control terminal of the pull-down transistor, and gates the second latch output with the enable input.

10. The tri-state sense amplifier of claim 9 wherein the first logic gate comprises a logic NAND gate.

11. The tri-state sense amplifier of claim 9 wherein the second logic gate comprises a logic AND gate.

12. The tri-state sense amplifier of claim 9 wherein one of the pull-up and pull-down transistors comprises a P-channel transistor and the other comprises an N-channel transistor.

13. The tri-state sense amplifier of claim 9 wherein the latch comprises:

a pair of cross-coupled inverters, which are coupled between the first and second complementary inputs and the first and second latch outputs.

14. The tri-state sense amplifier of claim 9 wherein the enable circuit comprises at least one N-channel transistor coupled in series between the latch and the second voltage supply terminal and having a gate coupled to the enable input.

15. The tri-state sense amplifier of claim 9 and further comprising:

a first isolation transistor coupled in series with the first input and having a control terminal coupled to the enable input; and a second isolation transistor coupled in series with the second input and having a control terminal coupled to the enable input.

16. A tri-state sense amplifier comprising:

an enable input;

a latch comprising first and second complementary inputs and first and second complementary latch outputs;

first and second voltage supply terminals, wherein the latch is biased between the first and second voltage supply terminals;

enable means coupled in series between the latch and at least one of the first and second voltage supply terminals for selectively enabling the latch as a function of the enable input;

logic means for gating the first and second latch outputs with the enable input to produce first and second complementary gated outputs, respectively; and output driver means for producing a data output based on the first and second complementary gated outputs, wherein the data output has either a logic high state, a logic low state or a high impedance state.

* * * * *